(12) United States Patent
Troccoli et al.

(10) Patent No.: US 11,157,717 B2
(45) Date of Patent: Oct. 26, 2021

(54) THERMALLY CONDUCTIVE AND PROTECTIVE COATING FOR ELECTRONIC DEVICE

(71) Applicant: Next Biometrics Group ASA, Oslo (NO)

(72) Inventors: Matias N. Troccoli, Kirkland, WA (US); Tian Xiao, Everett, WA (US)

(73) Assignee: NEXT Biometrics Group ASA, Oslo (NO)

(*) Notice: Subject to any disclaimer, the term of this patent is extended or adjusted under 35 U.S.C. 154(b) by 16 days.

(21) Appl. No.: 16/506,629

(22) Filed: Jul. 9, 2019

(65) Prior Publication Data

US 2020/0019750 A1 Jan. 16, 2020

Related U.S. Application Data

(60) Provisional application No. 62/695,969, filed on Jul. 10, 2018.

(51) Int. Cl.
*G06K 9/00* (2006.01)
*B32B 7/022* (2019.01)
(Continued)

(52) U.S. Cl.
CPC .......... *G06K 9/00053* (2013.01); *B32B 7/022* (2019.01); *C23C 28/046* (2013.01);
(Continued)

(58) Field of Classification Search
None
See application file for complete search history.

(56) References Cited

U.S. PATENT DOCUMENTS 4,597,808 A * 7/1986 Tachikawa ................ C23C 8/36
148/222
4,656,101 A * 4/1987 Yamazaki ............. H01L 21/318
428/620
(Continued)

FOREIGN PATENT DOCUMENTS

CN 102011090 A * 4/2011
CN 103187131 A * 7/2013
(Continued)

OTHER PUBLICATIONS

Machine Translation of WO2014141821A1, Sep. 2014 (Year: 2014).*
(Continued)

*Primary Examiner* — Jeffrey A Vonch
(74) *Attorney, Agent, or Firm* — Duane Morris LLP (57) ABSTRACT

A protective coating layer, an electronic device including such a protective coating layer, and the methods of making the same are provided. The electronic device includes a substrate, a thin film circuit layer disposed over the substrate, and a protective coating layer disposed over the thin film circuit layer. The protective coating layer includes a first coating and a second coating disposed over the first coating. Each coating has a cross-plane thermal conductivity in a direction normal to a respective coating surface equal to or higher than 0.5 W/(m*K). The first coating and the second coating have different crystal structures, or different crystalline orientations, or different compositions, or a combination thereof to provide different nanoindentation hardness. The first coating has a hardness lower than that of the second coating.

21 Claims, 7 Drawing Sheets

(51) Int. Cl.

| | | |
|---|---|---|
| *C23C 28/04* | (2006.01) | |
| *H01L 23/28* | (2006.01) | |
| *C23C 28/00* | (2006.01) | |
| *B32B 17/06* | (2006.01) | |
| *B32B 17/10* | (2006.01) | |
| *B32B 27/06* | (2006.01) | |
| *H01L 23/00* | (2006.01) | |
| *H01L 23/31* | (2006.01) | |
| *H01L 23/29* | (2006.01) | |
| *C23C 14/06* | (2006.01) | |
| *C23C 16/34* | (2006.01) | |
| *C23C 16/30* | (2006.01) | |
| *C23C 16/26* | (2006.01) | |

(52) U.S. Cl.
CPC ............ *C23C 28/048* (2013.01); *C23C 28/40* (2013.01); *C23C 28/42* (2013.01); *C23C 28/44* (2013.01); *H01L 23/28* (2013.01); *B32B 17/06* (2013.01); *B32B 17/10* (2013.01); *B32B 27/06* (2013.01); *B32B 2250/40* (2013.01); *B32B 2250/42* (2013.01); *B32B 2255/20* (2013.01); *B32B 2255/24* (2013.01); *B32B 2255/26* (2013.01); *B32B 2255/28* (2013.01); *B32B 2307/204* (2013.01); *B32B 2307/302* (2013.01); *B32B 2307/554* (2013.01); *B32B 2307/558* (2013.01); *B32B 2307/584* (2013.01); *B32B 2307/702* (2013.01); *B32B 2307/704* (2013.01); *B32B 2313/04* (2013.01); *B32B 2315/00* (2013.01); *B32B 2327/12* (2013.01); *B32B 2457/00* (2013.01); *B32B 2457/14* (2013.01); *C23C 14/0605* (2013.01); *C23C 14/0641* (2013.01); *C23C 14/0647* (2013.01); *C23C 16/26* (2013.01); *C23C 16/303* (2013.01); *C23C 16/34* (2013.01); *C23C 16/342* (2013.01); *C23C 28/04* (2013.01); *G06K 9/0002* (2013.01); *H01L 23/29* (2013.01); *H01L 23/291* (2013.01); *H01L 23/3192* (2013.01); *H01L 23/562* (2013.01); *Y10S 428/9088* (2013.01); *Y10T 428/24942* (2015.01); *Y10T 428/24983* (2015.01); *Y10T 428/3154* (2015.04)

(56) References Cited

U.S. PATENT DOCUMENTS

| | | | | |
|---|---|---|---|---|
| 4,731,303 A * | 3/1988 | Hirano | B23B 27/148 | 428/698 |
| 4,770,923 A * | 9/1988 | Wasa | G11B 5/72 | 257/E23.118 |
| 4,783,368 A * | 11/1988 | Yamamoto | H01L 21/4803 | 257/E23.006 |
| 4,996,079 A * | 2/1991 | Itoh | C23C 16/517 | 427/570 |
| 5,429,998 A * | 7/1995 | Someno | C04B 35/597 | 501/98.1 |
| 5,580,429 A * | 12/1996 | Chan | C23C 14/325 | 204/192.38 |
| 5,670,252 A * | 9/1997 | Makowiecki | B82Y 10/00 | 359/584 |
| 5,707,717 A * | 1/1998 | Shibahara | B29C 33/56 | 428/212 |
| 5,897,751 A * | 4/1999 | Makowiecki | C23C 14/185 | 204/192.15 |
| 5,907,627 A * | 5/1999 | Borza | G06K 9/0002 | 382/124 |
| 5,963,679 A * | 10/1999 | Setlak | G06K 9/0002 | 382/312 |
| 6,016,355 A * | 1/2000 | Dickinson | G01B 7/004 | 382/124 |
| 6,088,471 A * | 7/2000 | Setlak | G06K 9/00053 | 382/116 |
| 6,091,082 A * | 7/2000 | Thomas | G06K 9/00053 | 257/637 |
| 6,316,734 B1 * | 11/2001 | Yang | C23C 16/545 | 174/250 |
| 6,396,864 B1 * | 5/2002 | O'Brien | H01L 51/529 | 372/49.01 |
| 6,411,727 B1 * | 6/2002 | Harkin | G06K 9/0002 | 382/124 |
| 6,461,731 B1 * | 10/2002 | Veerasamy | B05D 5/083 | 428/408 |
| 6,762,470 B2 * | 7/2004 | Siegel | G06K 9/00053 | 257/414 |
| 9,147,100 B1 * | 9/2015 | Lin | G06K 9/00053 | |
| 9,465,973 B1 * | 10/2016 | Lin | G06K 9/0002 | |
| 2001/0026636 A1 | 10/2001 | Mainguet | G06K 9/00026 | 382/124 |
| 2001/0031346 A1 * | 10/2001 | Iwamura | C23C 28/046 | 428/212 |
| 2002/0009593 A1 * | 1/2002 | Veerasamy | B08B 17/06 | 428/408 |
| 2002/0114496 A1 * | 8/2002 | Frank | C10M 101/02 | 382/124 |
| 2002/0136933 A1 * | 9/2002 | Braendle | C23C 14/0664 | 428/698 |
| 2002/0158042 A1 * | 10/2002 | Lepert | G06K 9/00053 | 216/2 |
| 2003/0102874 A1 * | 6/2003 | Lane | G06K 9/00053 | 324/662 |
| 2003/0118843 A1 * | 6/2003 | Reiss | C23C 28/00 | 428/432 |
| 2003/0215116 A1 * | 11/2003 | Brandt | G06K 9/00053 | 382/124 |
| 2004/0038515 A1 * | 2/2004 | Siegel | G06K 9/00053 | 438/623 |
| 2004/0056269 A1 * | 3/2004 | Chen | H01L 51/5253 | 257/100 |
| 2004/0070407 A1 * | 4/2004 | Fang | G06K 9/00053 | 324/662 |
| 2004/0099926 A1 * | 5/2004 | Yamazaki | H01L 27/1266 | 257/632 |
| 2004/0185590 A1 * | 9/2004 | Miyai | G06K 9/00053 | 438/48 |
| 2004/0209125 A1 * | 10/2004 | Yamamoto | C23C 28/00 | 428/698 |
| 2004/0222802 A1 * | 11/2004 | Chou | G06K 9/00053 | 324/661 |
| 2005/0106877 A1 * | 5/2005 | Elers | C23C 16/44 | 438/689 |
| 2005/0170162 A1 * | 8/2005 | Yamamoto | C23C 28/341 | 428/216 |
| 2005/0231213 A1 * | 10/2005 | Chou | G06K 9/00053 | 324/662 |
| 2006/0006799 A1 * | 1/2006 | Yamazaki | H01L 51/5259 | 313/512 |
| 2006/0014041 A1 * | 1/2006 | Kohara | C23C 14/0641 | 428/621 |
| 2006/0099726 A1 * | 5/2006 | Ito | G06K 9/0002 | 438/10 |
| 2006/0147282 A1 * | 7/2006 | Bello | C23C 16/27 | 407/119 |
| 2006/0257663 A1 * | 11/2006 | Doll | C23C 28/044 | 428/408 |
| 2007/0054125 A1 * | 3/2007 | Akari | C23C 14/024 | 428/408 |
| 2007/0098993 A1 * | 5/2007 | Chen | C23C 28/044 | 428/408 |
| 2007/0141384 A1 * | 6/2007 | Ulrich | C23C 30/005 | 428/627 |
| 2007/0170857 A1 * | 7/2007 | Choi | H01L 51/5246 | 313/512 |
| 2008/0067546 A1 * | 3/2008 | Murata | H01L 23/3677 | 257/192 |

(56) References Cited

U.S. PATENT DOCUMENTS

| | | | |
|---|---|---|---|
| 2008/0176108 A1* | 7/2008 | Cheng | G11B 5/3106 428/814 |
| 2008/0229891 A1* | 9/2008 | Lechthaler | C23C 14/0641 83/13 |
| 2009/0022969 A1* | 1/2009 | Zhang | C23C 16/279 428/216 |
| 2009/0053491 A1* | 2/2009 | Loboda | H01L 21/02274 428/216 |
| 2009/0123779 A1* | 5/2009 | Endler | C23C 28/044 428/697 |
| 2010/0096710 A1* | 4/2010 | Chou | G06K 9/0002 257/414 |
| 2010/0102354 A1* | 4/2010 | Hsu | H01L 33/641 257/99 |
| 2010/0155935 A1* | 6/2010 | Prack | C23C 14/46 257/729 |
| 2010/0247885 A1* | 9/2010 | Ito | C23C 14/024 428/216 |
| 2011/0115763 A1* | 5/2011 | Yamazaki | H01L 29/7869 345/204 |
| 2011/0127562 A1* | 6/2011 | Sung | H05K 1/053 257/99 |
| 2011/0135898 A1* | 6/2011 | Bohlmark | C23C 14/0084 428/216 |
| 2011/0140367 A1* | 6/2011 | Shi | C23C 14/042 277/442 |
| 2011/0182488 A1* | 7/2011 | Bredholt | G06K 9/00026 382/124 |
| 2012/0242635 A1* | 9/2012 | Erhart | G06F 3/041 345/207 |
| 2013/0036463 A1* | 2/2013 | Shashidhar | G06Q 20/341 726/20 |
| 2013/0280480 A1* | 10/2013 | Uihlein | B32B 7/02 428/116 |
| 2014/0030494 A1* | 1/2014 | Chan | B32B 17/06 428/213 |
| 2014/0120350 A1* | 5/2014 | Kitsu | B32B 9/04 428/408 |
| 2014/0178637 A1* | 6/2014 | Rajagopalan | C23C 16/0272 428/141 |
| 2014/0255286 A1* | 9/2014 | Baik | C23C 14/345 423/290 |
| 2014/0331875 A1* | 11/2014 | Frye | G01B 9/02 101/170 |
| 2014/0332908 A1* | 11/2014 | Ho | H01L 21/561 257/414 |
| 2014/0332968 A1* | 11/2014 | Ho | H01L 24/05 257/773 |
| 2014/0332983 A1* | 11/2014 | Ho | H01L 23/3121 |
| 2015/0146944 A1* | 5/2015 | Pi | G06F 21/83 382/124 |
| 2015/0299470 A1* | 10/2015 | Ngo | G02B 1/118 345/173 |
| 2015/0323705 A1* | 11/2015 | Hart | G02B 27/0025 359/580 |
| 2015/0345013 A1* | 12/2015 | Paseuth | C23C 16/56 428/329 |
| 2016/0087242 A1* | 3/2016 | Chen | H01L 51/0097 257/100 |
| 2016/0111684 A1* | 4/2016 | Savas | C23C 16/308 257/40 |
| 2016/0125220 A1* | 5/2016 | Lundahl | G06K 7/08 382/124 |
| 2016/0148035 A1* | 5/2016 | Bredholt | G06K 9/00053 382/124 |
| 2016/0204378 A1* | 7/2016 | Popp | H01L 51/5253 257/40 |
| 2017/0029931 A1* | 2/2017 | Hirano | B23B 51/00 |
| 2017/0364726 A1* | 12/2017 | Buchan | H01L 41/047 |
| 2018/0057941 A1* | 3/2018 | Huang | C23C 16/26 |
| 2018/0119282 A1* | 5/2018 | Lu | B32B 27/18 |
| 2018/0223436 A1* | 8/2018 | Schier | C23C 28/44 |
| 2018/0241000 A1* | 8/2018 | Okamoto | H01L 51/56 |
| 2019/0088903 A1* | 3/2019 | Naganawa | H01L 51/5256 |
| 2020/0280015 A1* | 9/2020 | Odaka | H05B 33/14 |

FOREIGN PATENT DOCUMENTS

| | | | | |
|---|---|---|---|---|
| CN | 104647820 A | * | 5/2015 | |
| CN | 106096492 A | * | 11/2016 | |
| CN | 107513690 A | * | 12/2017 | C23C 16/27 |
| EP | 0635871 A2 | * | 1/1995 | H01L 23/3732 |
| JP | 63020446 A | * | 1/1988 | |
| JP | 02080574 A | * | 3/1990 | |
| JP | 06215367 A | * | 8/1994 | |
| JP | 07228962 A | * | 8/1995 | C04B 41/52 |
| JP | 07258823 A | * | 10/1995 | |
| JP | 10265955 A | * | 10/1998 | H01L 23/3732 |
| JP | 2003290177 A | * | 10/2003 | |
| JP | 2004298348 A | * | 10/2004 | |
| JP | 2006061630 A | * | 3/2006 | |
| JP | 2007056324 A | * | 3/2007 | |
| JP | 2007296691 A | * | 11/2007 | B32B 27/06 |
| JP | 2017053020 A | * | 3/2017 | |
| KR | 20010046215 A | * | 6/2001 | C04B 41/52 |
| KR | 20050093933 A | * | 9/2005 | |
| WO | WO-2014141821 A1 | * | 9/2014 | B32B 27/06 |
| WO | WO-2016132562 A1 | * | 8/2016 | C23C 16/27 |
| WO | WO-2018038569 A1 | * | 3/2018 | C09J 167/00 |
| WO | WO-2019086216 A1 | * | 5/2019 | F04D 29/023 |
| WO | WO-2019097795 A1 | * | 5/2019 | H01L 51/529 |

OTHER PUBLICATIONS

Moraes et al., Thermal conductivity and mechanical properties of AlN-based thin films, Jun. 2016, Journal of Applied Physics, vol. 119, Issue 22, p. 225304 (Year: 2016).*

Anders et al., Multilayers of amorphous carbon prepared by cathodic arc deposition, Oct. 1997, Surface and Coatings Technology, vol. 94-95, pp. 189-194 (Year: 1997).*

Jankowski et al., Chemical bonding in hard boron-nitride multilayers, Jun. 1997 (Year: 1997).*

Haubner et al., Boron Nitrides—Properties, Synthesis and Applications, Jun. 2002, High Performance Non-Oxide Ceramics II, pp. 1-45 (Year: 2002).*

Corbella Roca, Thin film structures of diamond-like carbon prepared by pulsed plasma techniques, Jan. 2006, Departament de Fisica Aplicada i Optica, University of Barcelona (Year: 2006).*

Shamsa et al., Thermal conductivity of diamond-like carbon films, Oct. 2006, Applied Physics Letters, vol. 89 (Year: 2006).*

Teo et al., Thermal stability of nonhydrogenated multilayer amorphous carbon prepared by the filtered cathodic vacuum arc technique, Mar. 2007, Journal of Vacuum Science & Technology A, vol. 25, Issue 421 (Year: 2007).*

Balandin et al., Thermal conductivity of ultrathin tetrahedral amorphous carbon films, Jul. 2008, Applied Physics Letters, vol. 93 (Year: 2008).*

Rachbauer et al., Temperature driven evolution of thermal, electrical, and optical properties of Ti—Al—N coatings, Mar. 2012, Acta Materialia, vol. 60, Issue 5, pp. 2091-2096 (Year: 2012).*

Pan et al., Enhanced thermal conductivity of polycrystalline aluminum nitride thin films by optimizing the interface structure, Jul. 2012 .Journal of Applied Physics, vol. 112 (Year: 2012).*

Keckes et al., Self-organized periodic soft-hard nanolamellae in polycrystalline TiAlN thin films, Oct. 2013, Thin Solid Films, vol. 545, Issue 31, pp. 29-32 (Year: 2013).*

Aubain, Determination of the Thermal Conductivity of Dielectric Thin Films through Experimental Measurement and Crystallographic Analysis, 2013 (Year: 2013).*

Samani et al., Thermal conductivity of titanium nitride/titanium aluminum nitride multilayer coatings deposited by lateral rotating cathode arc, Mar. 2015, Thin Solid Films, vol. 538, Issue 133 (Year: 2015).*

Chen et al., Thermal conductivity of polymer-based composites: Fundamentals and applications, Progress in Polymer Science, Aug. 2016, vol. 59, pp. 41-85 (Year: 2016).*

(56) References Cited

OTHER PUBLICATIONS

Panda et al., Reduction of residual stress in AlN thin films synthesized by magnetron sputtering technique, Oct. 2017, Materials Chemistry and Physics, vol. 200, pp. 78-84 (Year: 2017).*
Zhu et al., Thermal conductivity of amorphous SiO2 thin film: A molecular dynamics study, Jul. 2018, Scientific Reports, vol. 8 (Year: 2018).*
Uny et al., Ti—Al—N-Based Hard Coatings: Thermodynamical Background, CVD Deposition, and Properties. A Review, May 2018, Coatings and Thin-Film Technologies (Year: 2018).*
Meindlhumer et al., Biomimetic hard and tough nanoceramic Ti—Al—N film with self-assembled six-level hierarchy, Apr. 2019, Nanoscale, Issue 16 (Year: 2019).*
Kudyakova et al., Structure, microhardness and thermal conducting properties of the high-pressure high-temperature-treated Al—Ti—N materials, Jan. 2019, Applied Physics A, vol. 125 (Year: 2019).*
Gilvan Barroso et al., Polysilazane-Based Coatings with Anti-Adherent Properties for Easy Release of Plastics and Composites from Metal Molds, Avanced Materials, Adv. Mater. Interfaces 2020, 7, 1901952, 2020. Published by Wiley-VCH Verlag GmbH & Co.—KGaA, Weinheim.
H. Harris et al., Plasma enhanced metalorganic chemical vapor deposition of amorphous aluminum nitride, Journal of Applied Physics 90, 5825 (2001); https://doi.org/10.1063/1.1413484.
C. H. Henager, Jr. et al., Termal Conductivities of Thin, Sputtered Optical Films, May 1991, Pacific Northwest Laboratory, Richland, Washington 99352.
Gustavo Sánchez Matron, Piezoelectric Aluminum Nitride Thin Films by PECVD, Co-advised Thesis For The Degree of Doctor en Ingeniería Química de la Facultad de Ingeniería De Montevideo, Universidad de la República Oriental del Uruguay Université de Limoges (France), Feb. 12, 2009.
Karl E. Spear, Diamond—Ceramic Coating of the Future, Journal of the American Ceramic Society, vol. 72, No. 2, Feb. 1989.
Yan Zhou et al., Thermal characterization of polycrystalline diamond thin film heat spreaders grown on GaN HEMTs, Appl. Phys. Lett. 111, 041901 (2017); https://doi.rg/10.1063/1.4995407, Published online Jul. 24, 2017.

* cited by examiner

THERMALLY CONDUCTIVE AND PROTECTIVE COATING FOR ELECTRONIC DEVICE

PRIORITY CLAIM AND CROSS-REFERENCE

This application claims the benefit of U.S. Provisional Application No. 62/695,969, filed Jul. 10, 2018, which application is expressly incorporated by reference herein in its entirety.

FIELD OF THE INVENTION

The disclosure relates to coatings for electronic devices generally. More particularly, the disclosed subject matter relates to a protective coating layer for electronic devices such as fingerprint sensors and other thin film electronic devices requiring mechanical and environmental protection, and efficient heat dissipation.

BACKGROUND

A fingerprint sensor based on the principle of "active thermal sensing" includes an array of pixels. Each pixel includes a micro heat generator and a temperature sensor based on thin film devices. Fingerprint images are mapped based on the minute temperature differences in sensor surface areas corresponding to the "valley" and "ridge" regions of a fingerprint. Upon sensor pixel heating by the micro heat generator, localized sensor surface areas corresponding to the "valley" regions of the fingerprint become hotter than those corresponding to the "ridge" regions of the fingerprint. This is because heat dissipation in the "valley" regions can only occur by heat radiation, which is much less efficient than heat dissipation in the "ridge" regions which can occur by both heat conduction and heat radiation.

SUMMARY

The present disclosure provides a protective coating layer, an electronic device comprising such a protective coating layer, and the methods of making the same.

In one aspect, the present disclosure provides an electronic device. In accordance with some embodiments, the electronic device comprises a substrate, a thin film circuit layer disposed over the substrate, and a protective coating layer disposed over the thin film circuit layer. The protective coating layer comprises a first coating, and a second coating disposed over the first coating. Each of the first coating and the second coating has a cross-plane thermal conductivity in a direction normal to a respective coating surface equal to or higher than 0.5 W/(m*K). The first coating and the second coating have different crystal structures, or different crystalline orientations, or different compositions, or a combination thereof to provide different hardness measured using nanoindentation. The first coating has a hardness lower than that of the second coating.

The substrate may be flexible or rigid. In some embodiments, the substrate comprises a polymer or plastics such as polyimide and polyester. The electronic device is flexible. In some embodiments, the substrate comprises glass or silicon wafer, and the electronic device is rigid.

In some embodiments, the electronic device is a device for finger touch uses. For example, the thin film circuit layer may include fingerprint sensors, thin film transistors and other electronic components.

In some embodiments, each of the first coating and the second coating is made a material, which is thermally conductive. Examples of a suitable material include, but are not limited to silicon nitride, silicon oxynitride, boron nitride, boron oxynitride, aluminum nitride, aluminum oxynitride, aluminum boron nitride, silicon boron nitride, silicon aluminum nitride, SiAlON, titanium aluminum nitride, chromium nitride, tungsten nitride, and a combination thereof.

The first coating may be referred as a soft material while the second coating may be referred as a hard material. In some embodiments, the first coating has a hardness in a range of from 0.2 GPa to 1 GPa, and the second coating has a hardness in a range of from 1.1 GPa to 10 GPa. Such a combination of the first coating and the second coating may be applicable to both flexible and rigid electronic devices, in which the substrate may be made of a flexible material such as plastics and a rigid material such as glass or silicon wafer, respectively.

In some embodiments, the first coating has a hardness in a range of from 0.5 GPa to 10 GPa, and the second coating has a hardness in a range of from 10.1 GPa to 20 GPa. Such a combination of the first coating and the second coating may be applicable to rigid electronic devices having a rigid substrate.

In some embodiments, the protective coating layer has a two-layer structure comprising the first coating and the second coating.

In some embodiments, the protective coating layer has a three-layer sandwich structure comprising an additional second coating disposed below the first coating and above the thin film circuit layer. The first coating is disposed between two layers of the second coatings.

In some embodiments, the protective coating layer comprises a plurality of alternating layers of the first coating and the second coating. For example, the protective coating layer may include the first coating, the second coating, the first coating and then the second coating. The protective coating layer may include four, five, six or any other suitable coating layers in some embodiments.

The first coating and the second coating may include different combinations of soft and hard materials. For example, in some embodiments, the first coating is made of hexagonal boron nitride (h-BN) and the second coating is made of cubic boron nitride (c-BN), which is harder than h-BN.

In some embodiments, the first coating and the second coating are made of hexagonal boron nitride (h-BN). A hexagonal plane of boron nitride in the first coating is oriented substantially parallel to the protective coating layer. A hexagonal plane of boron nitride in the second coating is oriented substantially normal to the protective coating layer, providing higher hardness and higher thermal conductivity at this direction.

In some embodiments, the first coating and the second coating are made of diamond-like carbon (DLC), and the second coating has a ratio of $sp^3$ to $sp^2$ DLC structures higher than that of the first coating. The higher content of $sp^3$ DLC structures provides higher hardness.

In some embodiments, the first coating comprises aluminum nitride being amorphous, or having randomly oriented Wurtzite crystal structures. The second coating comprises aluminum nitride having Wurtzite crystal structure with 001 or 002 crystal plane direction (or c-axis) oriented substantially normal to the protective coating layer.

In some embodiments, at least one of the first coating and the second coating having aluminum nitride further comprises titanium nitride. A molar ratio of Ti/(Al+Ti) is in a range of from 0.01 to 0.6, for example, in a range of from 0.05 to 0.4.

In some embodiments, the protective coating layer has a thickness of equal to or less than 5 microns in total, for example, in a range of from 0.2 micron to 3 microns. Each individual coating layer may be less than 4 microns, 3 microns or 2 microns thick, but greater than 0.01 micron thick. No interfacial layer such as an adhesive is used between the first coating and the second coating.

The protective coating layer may have an oleophobic and/or hydrophobic top surface. In some embodiments, the protective coating layer further comprises a fluoropolymer or a fluorochemical deposited or grafted on the top surface of the protective coating layer, resulting in an effective anti-smudge hard coating. There is no other materials coated onto the protective coating, which is for direct contact with fingers of users.

In some embodiments, the present disclosure provides an electronic device, which comprises a substrate, a thin film circuit layer disposed over the substrate, and a protective coating layer disposed over the thin film circuit layer. The protective coating layer has a sandwich structure comprising a first coating and two layers of a second coating: one layer of the second coating disposed below the first coating and the other layer of the second coating disposed over the first coating. Each of the first coating and the second coating has a cross-plane thermal conductivity in a direction normal to a respective coating surface equal to or higher than 0.5 W/(m*K), for example, equal to or higher than 1 W/(m*K), 4 W/(m*K), or 5 W/(m*K). The first coating and the second coating have different crystal structures, or different crystalline orientations, or different compositions, or a combination thereof to provide different hardness measured using nanoindentation. The first coating has a hardness lower than that of the second coating. The first and the second coatings may be made of the materials as described above.

In another aspect, the present disclosure provides the protective coating layer as described above.

In another aspect, the present disclosure provides a method of forming the protective coating layer and making the electronic device described above. In some embodiments, such a method comprising steps of providing an electronic device being fabricated, which includes a substrate and a thin film circuit layer disposed over the substrate, and forming a protective coating layer over the thin film circuit layer.

The step of forming the protective coating layer comprises at least one step of forming the first coating; and at least one step of forming the second coating. The coating procedures depend on the structure of the protective coating layer. Each of the first coating and the second coating may be formed using a suitable coating process. Examples of a suitable coating process include, but are not limited to chemical vapor deposition (CVD), physical vapor deposition (PVD), ion-assisted deposition (IAD), sputtering, and a combination thereof. For example, a CVD process may include plasma-enhanced chemical vapor deposition (PECVD). A PECVD or sputtering process may include ion bombardment. A PVD technique may include or be combined with IAD. An IAD process may include ion-assisted electron beam evaporation. A sputtering process may include reactive sputtering.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like reference numerals denote like features throughout specification and drawings.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

For purposes of the description hereinafter, it is to be understood that the embodiments described below may assume alternative variations and embodiments. It is also to be understood that the specific articles, compositions, and/or processes described herein are exemplary and should not be considered as limiting.

In the present disclosure the singular forms "a," "an," and "the" include the plural reference, and reference to a particular numerical value includes at least that particular value, unless the context clearly indicates otherwise. When values are expressed as approximations, by use of the antecedent "about," it will be understood that the particular value forms another embodiment. As used herein, "about X" (where X is a numerical value) preferably refers to ±10% of the recited value, inclusive. For example, the phrase "about 8" preferably refers to a value of 7.2 to 8.8, inclusive. Where present, all ranges are inclusive and combinable. For example, when a range of "1 to 5" is recited, the recited range should be construed as including ranges "1 to 4", "1 to 3", "1-2", "1-2

& 4-5", "1-3 & 5", "2-5", and the like. In addition, when a list of alternatives is positively provided, such listing can be interpreted to mean that any of the alternatives may be excluded, e.g., by a negative limitation in the claims. For example, when a range of "1 to 5" is recited, the recited range may be construed as including situations whereby any of 1, 2, 3, 4, or 5 are negatively excluded; thus, a recitation of "1 to 5" may be construed as "1 and 3-5, but not 2", or simply "wherein 2 is not included." It is intended that any component, element, attribute, or step that is positively recited herein may be explicitly excluded in the claims, whether such components, elements, attributes, or steps are listed as alternatives or whether they are recited in isolation.

Open terms such as "include," "including," "contain," "containing" and the like mean "comprising." These open-ended transitional phrases are used to introduce an open ended list of elements, method steps or the like that does not exclude additional, unrecited elements or method steps. It is understood that wherever embodiments are described with the language "comprising," otherwise analogous embodiments described in terms of "consisting of and/or" consisting essentially of are also provided.

The transitional phrase "consisting of" and variations thereof excludes any element, step, or ingredient not recited, except for impurities ordinarily associated therewith.

The transitional phrase "consists essentially of," or variations such as "consist essentially of or" consisting essentially of excludes any element, step, or ingredient not recited except for those that do not materially change the basic or novel properties of the specified method, structure or composition.

The terms "substantial," "substantially," and variations thereof as used herein are intended to note that a described feature is equal or approximately equal to a value or description. Moreover, "substantially similar" is intended to denote that two values are equal or approximately equal. In some embodiments, "substantially similar" may denote values within about 10% of each other, such as within about 5% of each other, or within about 2% of each other.

Bulk materials of diamond, cubic or hexagonal form of boron nitride, silicon carbide, aluminum nitride and the like have high thermal conductivity (K), for example, in a range of from about 250 W/(m*K) to about 2200 W/(m*K), as well as high hardness ranging from 10 GPa to 100 GPa. However, the desirable thermal and mechanical properties of these materials may deteriorate drastically in thin film forms due to increased defect levels and lack of crystallinity in the thin films due to processing temperature and other substrate limitations. One example of large-scale application in thin film form, among these materials, is diamond like carbon (DLC) film. For example, a DLC film may have a hardness in a range of from about 18 GPa to about 23 GPa, which is adequate for use as protective hard coating in different applications.

However, it is very difficult to achieve thin film forms of these materials that simultaneously retain high hardness and other mechanical properties such as high fracture toughness and good thermal conductivity to dissipate heat effectively, especially those that can be fabricated at low temperatures (e.g., below 150° C.).

When ion bombardment is introduced during film growth, it helps to grow a dense and hard film, either by plasma-enhanced chemical vapor deposition (PECVD) or sputtering process. However, the ion bombardment process also builds up compressive stress inside the film such that at certain film thickness, for example, below 2-5 µm, the film starts to crack and delaminate from the substrate. Also, the lower thermal conductivity of the thin film also means that heat transfer across the film thickness drops precipitously with the increase of film thickness.

Meanwhile, to provide reliable mechanical and environmental protection of thin film electronic devices such as fingerprint sensors, much higher film thickness may be required to provide protection against scratch and impact, and against exposure to high humidity and high temperature. For flexible electronic devices and sensors, adequate resistance against bending is also required.

To maximize the image contrast between the "valley" and "ridge" regions of the fingerprint, preferential heat removal from the sensor surface areas is needed corresponding to the "ridge" and the "valley" regions of the fingerprint. At the same time, mechanical and environmental protections to the fingerprint sensor are needed. It is desirable to have a top protective coating, which may have a single-layer or multi-layer structure, over the array of "active thermal sensing" pixels. Such a top protective coating may need to possess the following properties:

1. Highly thermally conductive, preferably with higher thermal conductivity in the direction normal to the sensor surface as compared to the direction parallel to the sensor surface;

2. Electrically insulating, yet capable of dissipating electric charge build-up;

3. Highly mechanically reliable—offering effective sensor protection against scratching, impact and bending.

4. Dense, smooth and chemically, physically and thermally stable—offering effective sensor protection against chemicals and high humidity in the sensor operating temperature range, for example, from about −20° C. to about +70° C.;

5. Preferably having a hydrophobic/oleophobic surface, which leaves less fingerprint residues; and 6. Manufacturing friendly with high production efficiency and yield, preferably processible at low temperature to enable low-cost masking.

One of the goals of the present disclosure is to provide a new protective coating layer or coating system, which can provide the desirable properties described above, to enhance the performance and reliability of "active thermal sensing" fingerprint sensors, as well as other thin film electronic devices requiring mechanical and environmental protection, in addition to efficient heat dissipation.

The present disclosure provides a protective coating layer, an electronic device comprising such a protective coating layer, and the methods of making the same. The present disclosure provides a protective coating layer having high thermal conductivity, related coating materials, and the methods of making the same. The present disclosure also provides multi-layer coating layer having different configuration, which enable reliable mechanical and environmental protection of rigid and/or flexible electronic devices such as fingerprint sensors, and simultaneously provide efficient heat dissipation from the top surface. Embodiments of the protective coating layer meet the requirements and have the advantages described above.

Unless expressly indicated otherwise, references to "touch screen," "touch sensitive device," and "touch panel" made below will be understood to encompass an electronic device, which a user can give input or control the information processing system through simple or multi-touch gestures by touching the screen with a special stylus or one or more fingers. These terms are also referred as an electronic device for finger touch uses.

Unless expressly indicated otherwise, references to "a thin film circuit layer" made below will be understood to encompass a layer comprising thin film circuit elements such as integrated circuits including, but not limited to, transistors and other electronic components.

Unless expressly indicated otherwise, reference to "hardness" made herein will be understood to be the same as "nanoindentation hardness." The hardness is tested using nanoindentation, following ASTM E2546. During the testing, the nanoindenter indents a surface of a coating sample at a depth of no more than 50% of the thickness of the coating sample. In some embodiments, the load for nanoindentation is 100 mg.

Figure 1:
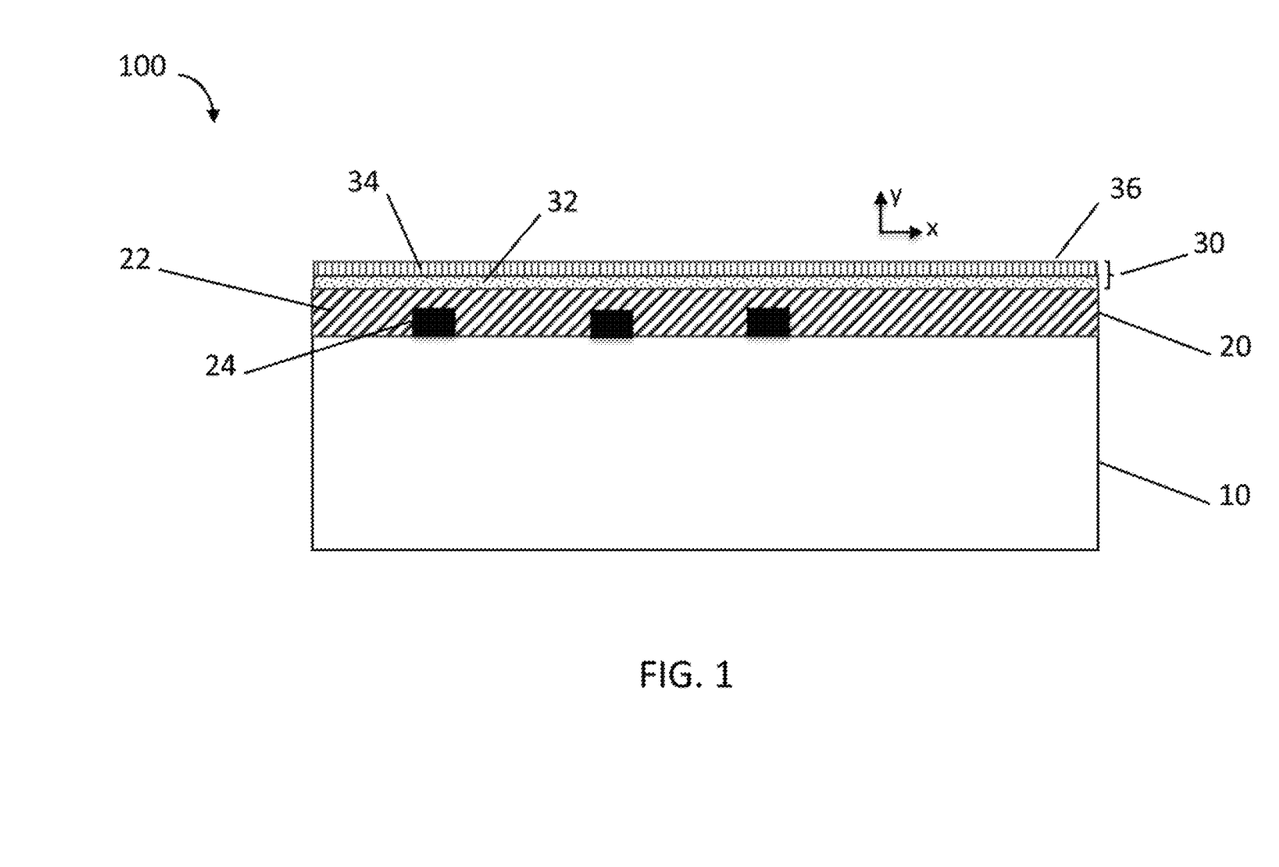
FIG. 1 is a sectional view illustrating an exemplary device comprising an exemplary protective coating layer including a first coating and a second coating in accordance with some embodiments.
Figure 3:
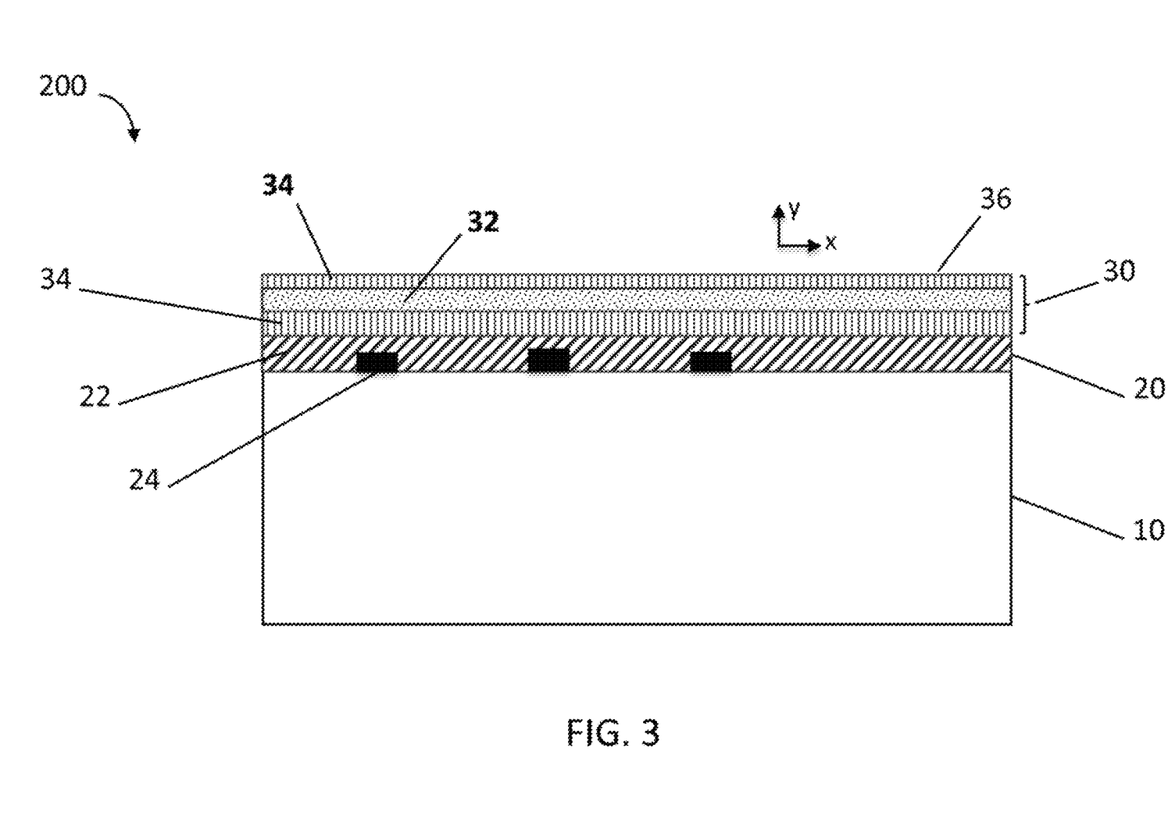
FIG. 3 is a sectional view illustrating an exemplary device comprising an exemplary coating system having a tri-layer configuration in accordance with some embodiments.
Figure 4:
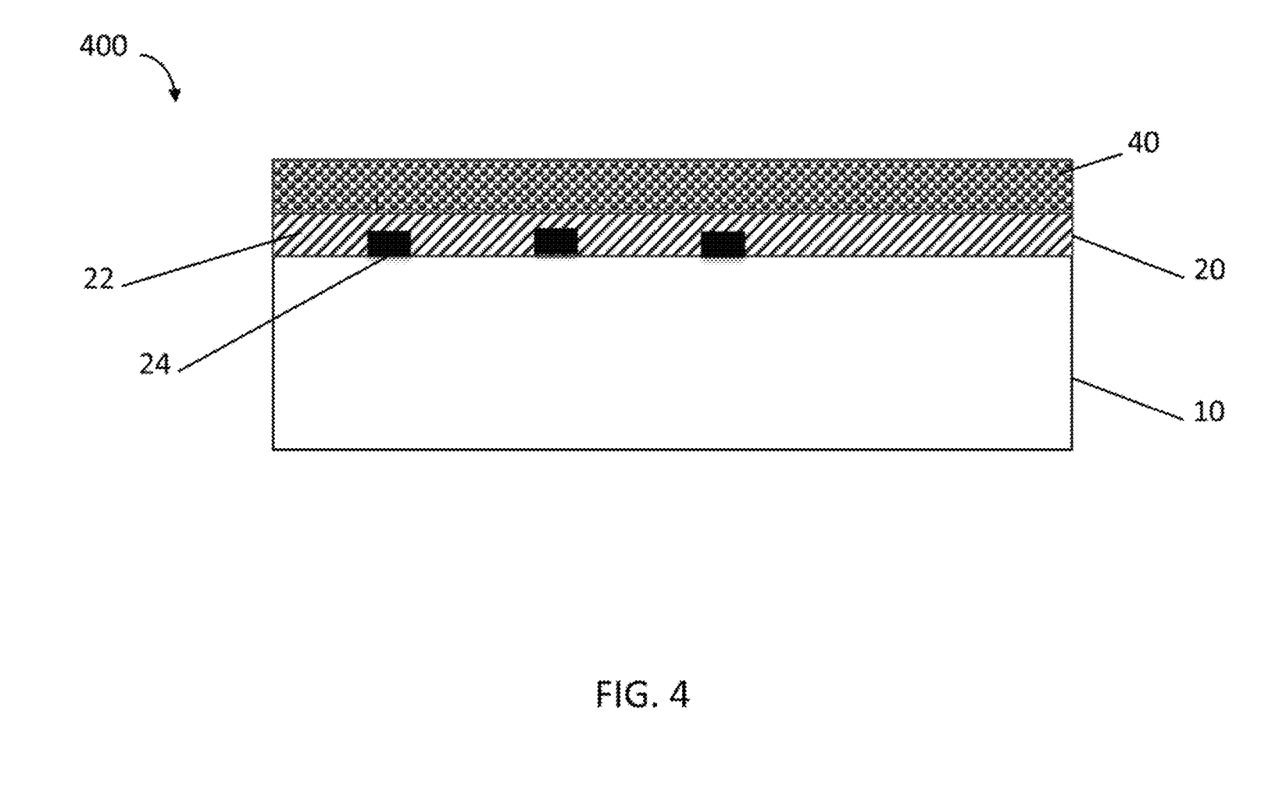
FIG. 4 is a sectional view illustrating an exemplary device comprising an exemplary coating system having a thick film in accordance with some embodiments.
Figure 5A:
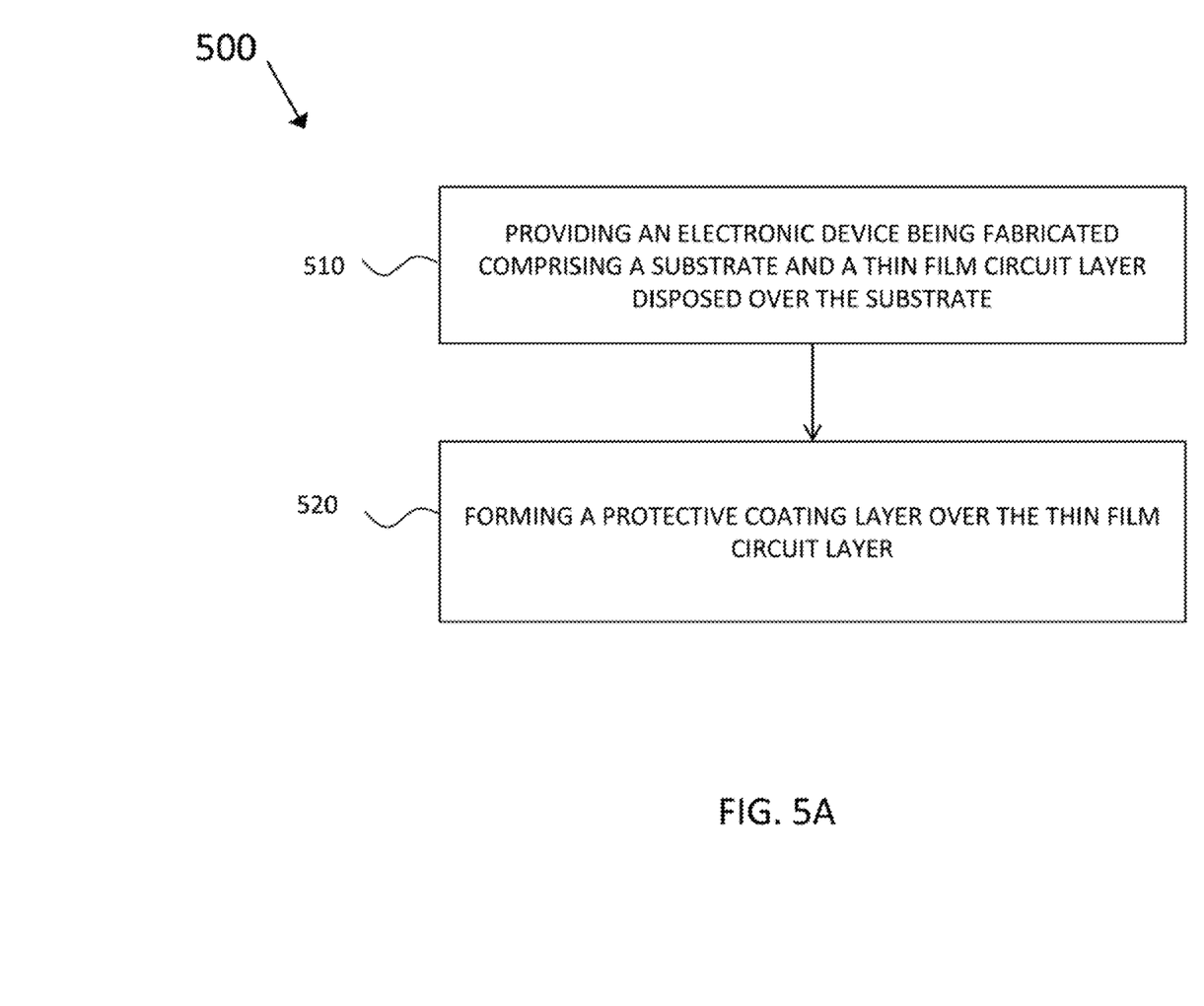
FIG. 5A is a flow chart illustrating an exemplary method of making the exemplary device in accordance with some embodiments.
Figure 5B:
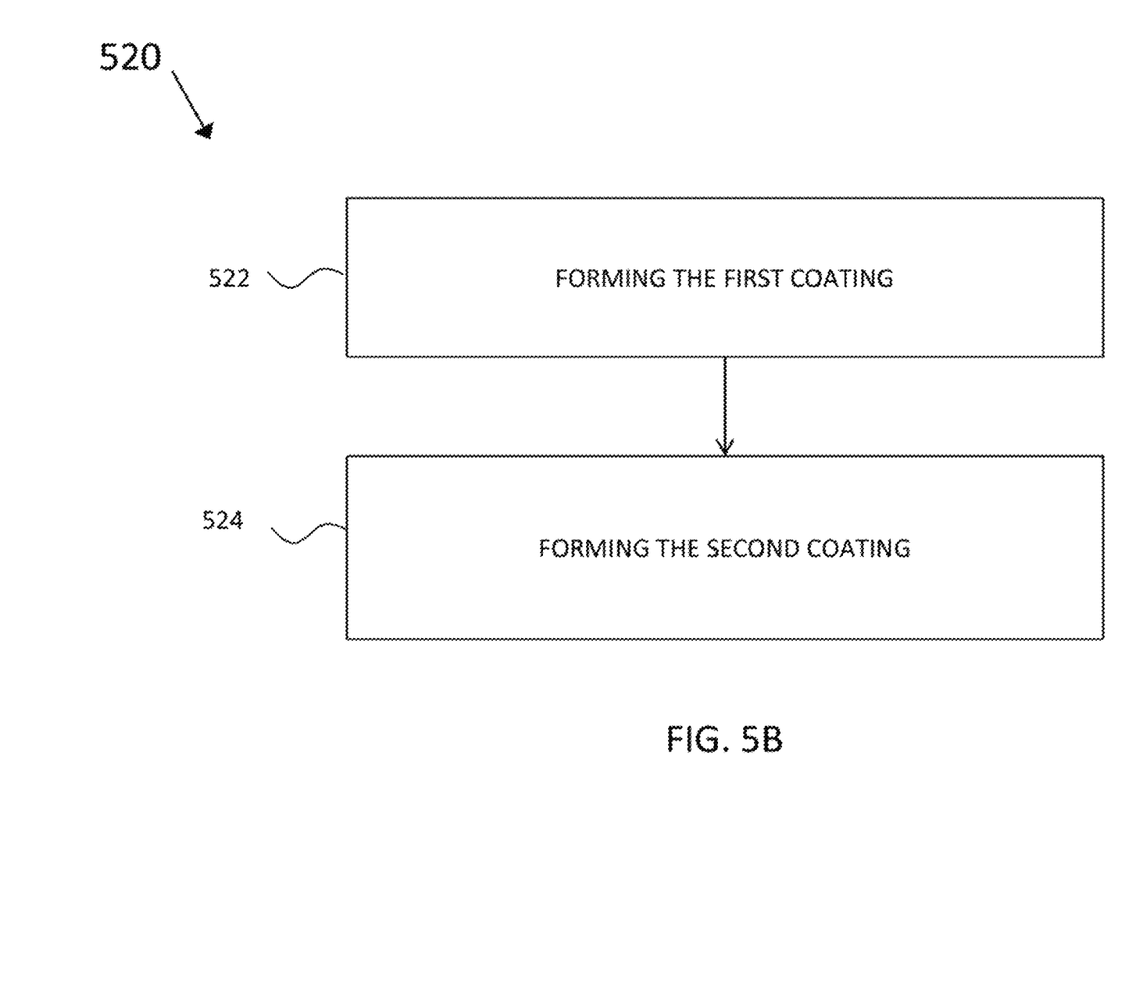
FIG. 5B is a flow chart illustrating an exemplary method of making an exemplary protective coating layer in accordance with some embodiments.
Figure 5C:
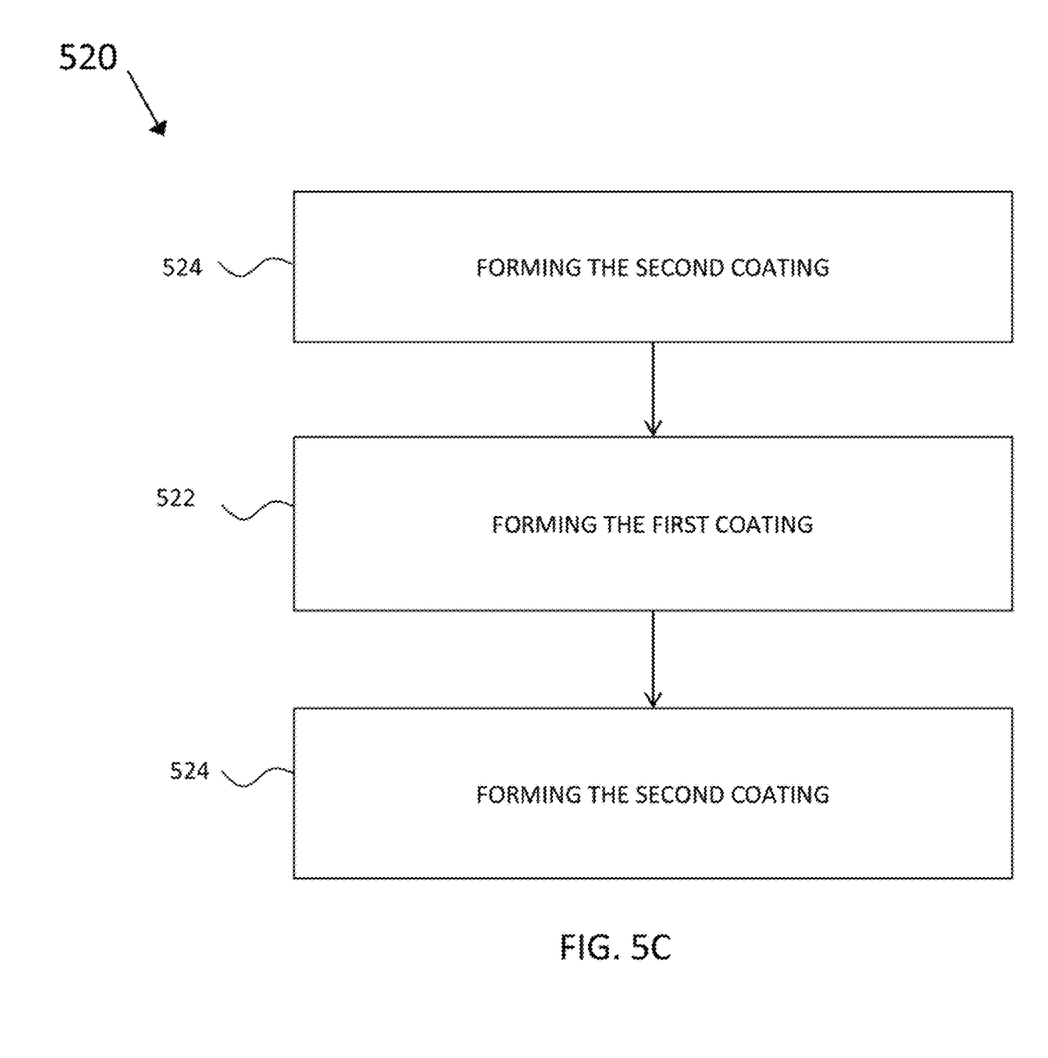
FIG. 5C is a flow chart illustrating an exemplary method of forming the protective coating layer in the exemplary device of FIG. 3 in accordance with some embodiments.

In FIGS. 1 and 3-4, like items are indicated by like reference numerals, and for brevity, descriptions of the structure, provided above with reference to the preceding figures, are not repeated. The methods described in FIGS. 5A-5C are described with reference to the exemplary structure described in FIGS. 1-4.

Referring to FIG. 1, an exemplary electronic device 100 comprises a substrate 10, a thin film circuit layer 20 disposed over the substrate 10, and a protective coating layer 30 disposed over the thin film circuit layer 20.

The substrate 10 may be flexible or rigid, or combination thereof. In some embodiments, the substrate 10 comprises a polymer or plastics such as polyimide and polyester. The electronic device 100 is flexible. In some embodiments, the substrate 10 comprises glass, silicon wafer or polysilicon, and the electronic device 100 is rigid. The substrate 10 made of glass or silicon may have a hardness of 15-20 GPa. In some embodiments, the substrate 10 comprises a combination of flexible materials such as polymer or plastics and rigid materials such as glass, silicon wafer or polysilicon. The substrate 10 may have a suitable thickness, for example, from 10 microns to 5 mm. In some embodiments, the substrate 10 is a glass substrate having a thickness equal to or larger than 100 microns.

The thin film circuit layer 20 may include thin film circuit elements 24 such as thin film transistors (TFT) and other electronic components, which may be disposed in a dielectric matrix 22. The electronic device 100 may be a device for finger touch uses. For example, the thin film circuit layer 20 may include fingerprint sensors in the thin film circuit elements 24.

The protective coating layer 30 comprises a first coating 32, and a second coating 34 disposed over the first coating 32. Each of the first coating 32 and the second coating 34 has a cross-plane thermal conductivity equal to or higher than 0.5 W/(m*K).

Unless expressly stated otherwise, the cross-plane thermal conductivity of the first coating 32, the second coating 34 or the protective coating layer 30 made herein refers to thermal conductivity in a direction (e.g., "y" direction in FIG. 1) normal to a respective coating surface (e.g., a plane along "x" direction in FIG. 1). In some embodiments, each of the first coating 32, the second coating 34 and the protective coating layer 30 overall has a cross-plane thermal conductivity equal to or higher than 5 W/(m*K), 10 W/(m*K), or 20 W/(m*K). Such thermal conductivity of each coating and the protective coating layer 30 overall may be up to 250 W/(m*K), 500 W/(m*K), 1,000 W/(m*K), or 2,000 W/(m*K). The thermal conductivity can be measured by using a differential 3ω technique. Such a technique is known and described in the art, for example, Moraes et al., "Thermal conductivity and mechanical properties of AlN-based thin films," Journal of Applied Physics, 119, 225304 (2016), which is incorporated herein by reference.

The first coating 32 and the second coating 34 have different crystal structures, or different crystalline orientations, or different compositions, or a combination thereof to provide different hardness measured using nanoindentation. The first coating 32 has a hardness lower than that of the second coating 34.

The first coating 32 may be referred to as a soft material while the second coating 34 may be referred to as a hard material. In some embodiments, the first coating 32 has a hardness in a range of from 0.2 GPa to 1 GPa, and the second coating 34 has a hardness in a range of from 1.1 GPa to 10 GPa. Such a combination of the first coating 32 and the second coating 34 may be applicable to both flexible and rigid electronic devices, in which the substrate 10 may be made of a flexible material such as plastics and a rigid material such as glass or silicon wafer, respectively, or a combination of both flexible and rigid materials.

In some embodiments, the first coating 32 has a hardness in a range of from 0.5 GPa to 10 GPa, and the second coating 34 has a hardness in a range of from 10.1 GPa to 20 GPa. Such a combination of the first coating and the second coating may be applicable to rigid electronic devices having a rigid substrate.

In some embodiments, each of the first coating 32 and the second coating 34 is made of a material that is thermally conductive. Examples of a suitable material include, but are not limited to silicon nitride, silicon oxynitride, boron nitride, boron oxynitride, aluminum nitride, aluminum oxynitride, aluminum boron nitride, silicon boron nitride, silicon aluminum nitride, SiAlON, titanium nitride, titanium aluminum nitride, chromium nitride, tungsten nitride, and a combination thereof. SiAlON is a compound comprising silicon, aluminum, oxygen and nitrogen.

Referring to FIG. 1, in some embodiments, the protective coating layer 30 has a two-layer structure comprising the first coating 32 and the second coating 34. FIG. 1 illustrates a bi-layer protective coating layer for thin film electronic devices such as fingerprint sensors, wherein the second coating 34 (e.g., the top layer) is harder than the first coating 32 (e.g., the bottom layer).

The first coating 32 and the second coating 34 may include different combinations of soft and hard materials. In some embodiments, the first coating 32 and the second coating 34 are made of a same material having different crystal structure, or a same crystal structure with different orientations, or different compositions, or any combination thereof.

For example, in some embodiments, the first coating 32 is made of hexagonal boron nitride (h-BN) and the second coating 34 is made of cubic boron nitride (c-BN), which is harder than h-BN. This can be achieved, for example, by depositing the first coating 32 with conditions favoring the growth of hexagonal boron nitride (h-BN), and then depositing the second coating 34 over the first coating 32 by switching to conditions favoring the growth of cubic boron nitride (c-BN). In some embodiments, hexagonal boron nitride (h-BN) may contain a small amount of hydrogen, for example, in a range of from 0.1 mol % to 3 mol %.

In some embodiments, the first coating 32—as the bottom layer comprising h-BN—may be made to have tensile stress, for example, by utilizing chemical reactions taking place beneath the film growth surface that favor the liberation of hydrogen during the film formation so that unsaturated B—N bonds are formed.

The top layer of c-BN may be made to have compressive stress, for example, through modest ion bombardment to the growing BN films, for example, by applying negative substrate bias or increasing the plasma intensity. The compressive stress helps form a denser and harder c-BN film on the top layer of the bi-layer protection film, while the bottom softer h-BN layer with tensile stress helps relieve the overall stress in the bi-layer system.

Figure 2:
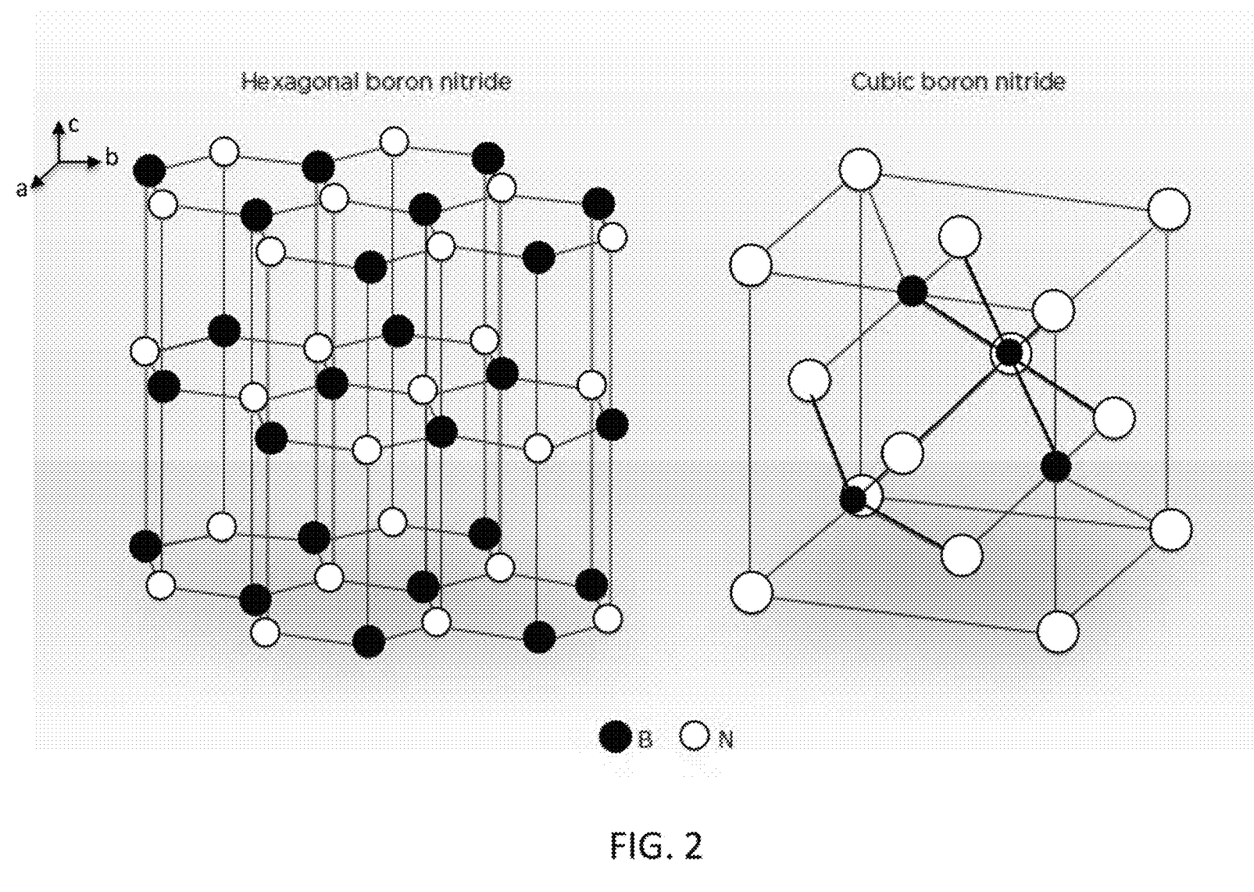
FIG. 2 illustrates crystal structures of hexagonal boron nitride (h-BN) and cubic boron nitride (c-BN).

Referring to FIG. 2, the crystal structures of h-BN and c-BN can be utilized to explain why h-BN is softer than c-BN. Hexagonal BN has a layered structure similar to graphite. As illustrated in FIG. 2, a plane for the layered structure, for example, along the direction of axis "a" and axis "b," is referred to as hexagonal BN plane or basal plane. The direction normal to the hexagonal BN plane (i.e., a-b plane in FIG. 2) is referred to as "c-axis." In the hexagonal BN plane, boron and nitrogen atoms are bound by strong covalent bonds within each layer, while the layers along the c-axis are held together by weak Van der Waals forces. In the cubic BN, alternately linked boron and nitrogen atoms form a tetrahedral bond network, as carbon atoms do in diamond. The three-dimensional covalent lattice makes the cubic BN much harder than the hexagonal BN, which is softer due to the much weaker inter-layer bonding forces.

In some embodiments, the first coating 32 and the second coating 34 are made of hexagonal boron nitride (h-BN), but with different orientations. For example, a hexagonal plane of boron nitride in the first coating 32 may be oriented substantially parallel to the protective coating layer 30. A hexagonal plane of boron nitride in the second coating 34 may be oriented substantially normal to the protective coating layer 30, providing higher hardness and higher thermal conductivity at this direction.

The bi-layer protection stack as shown in FIG. 1 can be achieved by using h-BN thin film in both the top and bottom layers. For example, the first coating 32, as the bottom layer including softer h-BN with tensile stress, may be first deposited using $B_2H_6$—$N_2$ gas in a PECVD system, followed by deposition of harder h-BN with compressive stress by switching to $B_2H_6$—$H_2$—$NH_3$ gas mixture. The top compressive film thus formed tends to have a textured microstructure with the basal planes perpendicular to the film surface. For example, the basal plane thermal conductivity of h-BN is as high as 400 $Wm^{-1}K^{-1}$, compared to 1300 $Wm^{-1}K^{-1}$ for c-BN in some embodiments, and can be an order of magnitude higher than out-of-plane thermal conductivity. Thus this creates a strongly anisotropic heat transfer favoring heat removal in the direction (i.e. y-direction in FIG. 1) vertical to the sensor surface. Such a combination and other combinations described herein provide a good protective coating layer for "active thermal sensing" fingerprint sensor applications, which are described in U.S. Pat. Nos. 6,091,837; 7,910,902; and 7,720,265, which are hereby incorporated by reference in their entireties herein. Better mechanical protection against scratch and impact can be achieved by the bi-layer protective coating with the harder film on top as described herein, while net film stress can be minimized by off-setting the tensile film stress with the compressive film stress.

In some embodiments, the bi-layer protective coating layer illustrated in FIG. 1 can also be achieved, for example, by depositing the bottom layer of the protective coating with conditions of lower-energy ion bombardment, followed by depositing the top layer of the protective coating with conditions of higher-energy ion bombardment, through ion-assisted deposition (IAD). Higher-energy ion bombardment results in higher content of cubic BN.

In some embodiments, the first coating 32 and the second coating 34 are made of diamond-like carbon (DLC), and the second coating 34 has a ratio of $sp^3$ to $sp^2$ DLC structures higher than that of the first coating. The higher content of $sp^3$ DLC structures provides higher hardness for the second coating 34. The higher content of $sp^2$ DLC structures makes the first coating 34 softer. The DLC coating may contain hydrogen at a suitable range, for example, from 0.1 mol % to 5 mol % or from 0.1 mol % to 2 mol %.

In some embodiments, the first coating 32 comprises aluminum nitride being amorphous, or having randomly oriented hexagonal closed-packed Wurtzite crystal structure and is softer. The second coating 34 comprises aluminum nitride having Wurtzite crystal structure with 001 or 002 crystal plane direction (e.g., y direction in FIG. 1) oriented substantially normal to the protective coating layer 30 and is harder.

The crystal structures of aluminum nitride and processing conditions to generate different structures of aluminum nitride are described in Iqbal et al., "Reactive sputtering of aluminum nitride (002) thin films for piezoelectric applications: a review," Sensors, 2018, 18, 1797, which is incorporated herein by reference. For example, the content of nitrogen in the coating process can be adjusted to change the crystal structures and orientations of aluminum nitride. In some embodiments, aluminum nitride, being amorphous or having randomly oriented crystal structure, is made with a high nitrogen content, for example, in a range of from 60% to 100%. A lower nitrogen content such as 40% results in aluminum nitride having Wurtzite crystal structure with 002 crystal plane direction oriented normal to a coating surface. The resulting aluminum nitride with such preferred 002 orientation is harder and has a high thermal conductivity along this direction (i.e., the cross-plane thermal conductivity for the second coating 34), for example, in the range of from 40 to 180 W/(m*K).

In some embodiments, each of the first coating 32 and the second coating comprises a mixture of aluminum nitride and titanium nitride. At least one of the first coating 32 and the second coating 34 having aluminum nitride as described herein further comprises titanium nitride. A molar ratio of Ti/(Al+Ti) may be in a range of from 0.01 to 0.6, for example, in a range of from 0.05 to 0.4. A mixture of aluminum nitride and titanium nitride (AlTiN) is preferably used compared to titanium nitride because titanium nitride may be electrically conductive and the mixture is not. Titanium nitride and the mixture AlTiN may be formed through reactive sputtering.

These exemplary combinations of the first coating 32 and the second coating 34 are for illustration only. The material choices for the first coating 32 as described can be combined with any material choice for the second coating 34. Some other materials having same or similar crystal structures can also be used as described herein.

In some embodiments, the bi-layer protective coating layer illustrated in FIG. 1 is useful when the substrate is flexible. Examples of a suitable flexible substrate include, but are not limited to, a plastic substrate having a single-layer or multiple-layer structure. During bending, for example, either concave or convex bending, the softer bottom protective coating 32 helps absorb a large amount of strain such that the strain can be effectively reduced in the harder top protective layer 34, making the top protective coating 34 less likely to crack or buckle upon bending. The softer bottom protective coating 32 serves to facilitate the formation of multiple neutral planes (where film stresses become zero) by allowing a large amount of strain to be absorbed in the middle softer layer in a stack of thin films.

Referring to FIG. 3, in some embodiments, an exemplary device 200 includes a protective coating layer 30 having a three-layer sandwich structure. Compared to the structure illustrated in FIG. 1, the protective coating layer 30 in FIG. 3 includes an additional second coating 34 disposed below the first coating 32 and above the thin film circuit layer 20. The first coating 32 is disposed and sandwiched between two layers of the second coatings 34.

The first coating 32 and the second coating 34 in the sandwich structure may include different combinations of soft and hard materials as described above. For example, in some embodiments, the first coating 32 is made of hexagonal boron nitride (h-BN), and is disposed between two layers of the second coating 34, which is made of harder cubic boron nitride (c-BN).

For another example, in some embodiments, the first coating 32 and the second coating 34 are made of h-BN, but with different orientations as described above. For another example, in some embodiments, the first coating 32 and the second coating 34 are made of diamond-like carbon, but with different ratio of $sp^3/sp^2$ structures as described above.

Referring to FIG. 3, the middle layer (corresponding to first coating 32) is softer than the top and bottom layers (corresponding to second coating 34) of the protective coating layer 30. In this configuration, a harder film with compressive stress, e.g., a h-BN thin film having textured microstructure with the basal planes perpendicular to the film surface, can be deposited directly above the sensor surface to maximize the benefits of anisotropic heat transfer favoring heat removal in the vertical direction. A softer film with tensile stress in the middle of the tri-layer protective coating system can then be implemented by changing the deposition condition of the growing film in-situ, e.g., by switching the gas mixture from $B_2H_6$—$H_2$—$NH_3$ to $B_2H_6$—$N_2$ during the growth of h-BN film. A harder, compressive, and thermally anisotropic film on the top can again be achieved by switching the gas mixture from $B_2H_6$—$N_2$ back to $B_2H_6$—$H_2$—$NH_3$.

In some embodiments, the tri-layer protective coating system illustrated in FIG. 3 can also be achieved, for example, by depositing the bottom layer of the protective coating with conditions of higher-energy ion bombardment, followed by depositing the middle layer with conditions of lower-energy ion bombardment, before depositing the top layer of the protective coating with conditions of higher-energy ion bombardment, through ion-assisted deposition (IAD).

In some embodiments, the first coating 32 and the second coatings 34 in the sandwich structure may be made of aluminum nitride or a mixture of aluminum nitride and titanium nitride as described above. For example, the first coating 32 may be made of aluminum nitride being amorphous, or having randomly oriented Wurtzite crystal structures. The second coating 34 may be made of aluminum nitride having Wurtzite crystal structure with 001 or 002 crystal plane direction (e.g., y direction in FIG. 3) oriented substantially normal to the protective coating layer 30. In some embodiments, each of the first coating 32 and the second coatings 34 comprises a mixture of aluminum nitride and titanium nitride. A molar ratio of Ti/(Al+Ti) may be in a range of from 0.01 to 0.6, for example, in a range of from 0.05 to 0.4.

In the protective coating layer 30 having the sandwich structure, each of the first coating 32 and the second coatings 34 has a cross-plane thermal conductivity in a direction (i.e. y-direction in FIG. 3) normal to a respective coating surface equal to or higher than 0.5 W/(m*K), for example, equal to or higher than 1 W/(m*K), 4 W/(m*K) or 5 W/(m*K). Such thermal conductivity of each coating and the protective coating layer 30 overall may be up to 250 W/(m*K), 500 W/(m*K), 1000 W/(m*K), or 2000 W/(m*K).

The structures in FIG. 1 and FIG. 3 are used for illustration only. The protective coating layer 30 may have different combinations of the first coating 32 and the second coatings 34.

In some embodiments, the protective coating layer 30 comprises a plurality of alternating layers of the first coating 32 and the second coating 34 as described herein. For example, the protective coating layer 30 may include the first coating 32, the second coating 34, the first coating 32 and then the second coating 34. The protective coating layer 30 may include four, five, six or any other suitable coating layers.

In some embodiments, the protective coating layer 30 has a thickness of equal to or less than 5 microns in total, for example, in a range of from 0.2 micron to 3 microns. Each individual coating layer such as the first coating 32 and the second coating 32 may be less than 4 microns, 3 microns, 2 microns or 1 micron. No interfacial layer such as an adhesive is needed between the first coating 32 and the second coating 34.

Better mechanical protection against scratch and impact, as well as better environmental protection, can be achieved by the higher thickness achievable through the tri-layer or multi-layer configuration, where net film stress can be minimized by off-setting the tensile film stress with the compressive film stress in different layers. Simultaneously, high thermal conductivity, especially in the cross-plane direction of the protective coating system, can be achieved.

Referring to FIG. 1 and FIG. 3, the protective coating layer 30 may have an oleophobic and/or hydrophobic top surface 36. In some embodiments, the protective coating layer 30 further comprises a fluoropolymer or a fluorochemical deposited or grafted on the top surface 36 of the protective coating layer, resulting in an effective antismudge hard coating. Such a top surface having fluoropolymer or fluorochemical layer may be made by electron-beam evaporation of an oxygen-containing species such as $SiO_2$ to incorporate oxygen on the top surface 36, followed by deposition of the fluoropolymer or fluorochemical, either by PVD or spray process. The fluoro-containing coating may be at molecular level or having a thickness at nanometer level. There is no other materials such as a substrate cover coated onto the protective coating 30, which defines the exterior surface and is for direct contact with fingers of users.

In some embodiments, even with help of residual film stress off-setting through bi-layer or tri-layer, or multi-layer design, the total practical thickness for the protection film stack may still be limited to 5 μm or below.

Referring to FIG. 4, an exemplary device 400 includes a substrate 10, a thin film circuit layer 20 disposed over the substrate 10, and a protective coating layer 40 disposed over the thin film circuit layer 20. Such a protective coating layer 40 comprises a thick film coating, for example, a thick film having a thickness of 5 μm or greater. In some embodiments, the thick film coating comprises at least 80 wt. % of at least one inorganic filler having high thermal conductivity so as to provide the thick film coating in the protective coating layer 40 with thermal conductivity greater than 10 W/(m*K). A suitable inorganic particle may be any materials for the first coating 32 or the second coating 34 as described above. The inorganic particle may be in any suitable shape such as spherical or elongated particles.

Protective coating structures thicker than 5 μm may offer even greater protection against scratch and impact (such as pen drop). These can be fabricated by thick film fabrication techniques such as screen printing. In some embodiments, "thin films" and "thick film" may be defined by thickness. However, in most other embodiments, the distinction between "thin film" and "thick film" may not be defined by an exact thickness value (such as 5 µm) that separates the two. "Thin films" may be deposited by vacuum techniques, whereas "thick films" may be deposited by non-vacuum techniques such as screen printing, so the distinction between the two may depend on the difference in deposition techniques. Prior to screen printing, a paste was prepared by dispersing high thermal conductivity particles such as BN, SiC or AlN into a solution of polymer binder with high Tg (such as polycarbonate), and its viscosity was then tuned by low boiling point solvent (such as chloroform). The proper selection of solvent enables a smooth printing on rigid and flexible substrates, without the need for post-printing heat treatments. The protective coating layer 40 may include a composite of inorganic particles and an organic polymer. The loading of inorganic high thermal conductivity particles can be higher than 80 wt %, and thermal conductivity greater than 10 $Wm^{-1}K^{-1}$ can be achieved. Compared to the configurations illustrated in FIG. 1 and FIG. 3, the thick film protective coating layer 40 in FIG. 4 offers greater mechanical protection at the expense of reduced heat transfer rate across the thicker and less thermally conductive film in some embodiments.

In some embodiments, the thick film coating has a top surface made smooth using a low-boiling point solvent in a thick film paste composition. Such a solvent facilitates room-temperature drying of the thick film paste composition and faster adhesion of the thick film coating to the underlying thin film circuit layer 20 over the substrate 10. The substrate may be a flexible substrate, a rigid substrate, and a combination thereof as described above.

The examples illustrated in FIGS. 1-4 are intended to demonstrate the principles embodied in the current inventions. Various changes and modifications to the embodiments herein chosen for purposes of illustration may be made. To the extent that such modifications and variations do not depart from the spirit of the invention, they are intended to be included within the scope thereof which is assessed only by a fair interpretation of the following claims.

For instance, while the materials such as boron nitride, DLC, aluminum nitride, and aluminum titanium nitride have been used to illustrate embodiments shown in FIG. 1 and FIG. 3, other suitable materials include, but are not limited to, silicon carbide, diamond, and other nitrides or oxynitrides. Such nitrides or oxynitrides may be of various non-metals, transition metals, and post-transition metals, with either single or mixed metals or non-metals. Other nitrides or oxynitrides include, but are not limited to silicon nitride, silicon oxynitride, boron oxynitride, aluminum oxynitride, aluminum boron nitride, silicon boron nitride, silicon aluminum nitride, SiAlONs, chromium nitride, tungsten nitride, and various mixtures thereof, The present disclosure also provides the protective coating layer 30 or layer 40 as described above. The present disclosure provides a method of forming the protective coating layer 30 and layer 40 and making the electronic device 100 or 200 or 400 described above.

Referring to FIG. 5A, an exemplary method for making an electronic device includes steps 510 and 520. At step 510, an electronic device being fabricated is provided. Such a device being made includes a substrate 10 and a thin film circuit layer 20 disposed over the substrate 10.

At step 520, a protective coating layer 30 is formed over the thin film circuit layer 20.

Referring to FIG. 5B, the step of forming the protective coating layer 30 comprises at least one step 522 and one step 524. At step 522, a first coating 32 is formed as described above. At step 524, a second coating 34 is formed as described above.

Each of the first coating 32 and the second coating 34 may be formed using a suitable coating process. Examples of a suitable coating process include, but are not limited to chemical vapor deposition (CVD), physical vapor deposition (PVD), ion-assisted deposition (IAD), sputtering, and a combination thereof. For example, a CVD process may include plasma-enhanced chemical vapor deposition (PECVD). A PECVD or sputtering process may include ion bombardment. A PVD technique may include or be combined with IAD. An IAD process may include ion-assisted electron beam evaporation. A sputtering process may be a reactive sputtering in some embodiments.

For example, in some embodiments, softer and harder coatings of nitrides or oxynitrides, or diamond like carbon (DLC), can be deposited by sputtering with lower-energy and higher-energy ion bombardment, respectively, through adjustment of substrate bias, sputtering power and pulse width etc. In some embodiments, softer and harder coatings of nitrides or oxynitrides, or diamond like carbon (DLC) can be deposited by ion-assisted deposition, with lower-energy and higher-energy ion bombardment, respectively, through the adjustment of ion source current and evaporation source parameters etc.

As an example, the harder h-BN film with compressive stress and textured microstructure with the basal planes perpendicular to the film surface, can be grown at 300° C., with radio frequency (RF) power of 0.25-0.5 $W/cm^2$ at gas pressure of 30-60 Pa, using $B_2H_6$—$H_2$—$NH_3$ gas system. The softer h-BN film with tensile stress can be grown at 300° C., with RF power of 0.5 $W/cm^2$ at gas pressure of 10-30 Pa, using $B_2H_6$—$N_2$ gas system.

The coating procedures depend on the structure of the protective coating layer 30. Two or more steps 522 and 524 may be used. For example, referring to FIG. 5C, the protective coating layer 30 having a sandwich structure as illustrated in FIG. 3 may be made through at least three steps including steps 524, 522, and 524 in sequence. At first, a layer of the second coating 34 is coated over the thin film coating layer 20. A first coating 32 is then formed over the layer of the second coating 34 at step 522. Another layer of the second coating 34 is formed over the first coating 32 to form a sandwich coating structure.

Although the subject matter has been described in terms of exemplary embodiments, it is not limited thereto. Rather, the appended claims should be construed broadly, to include other variants and embodiments, which may be made by those skilled in the art.

What is claimed is:

1. An electronic device, comprising:
a substrate
a thin film circuit layer disposed over the substrate; and
a protective coating layer disposed over the thin film circuit layer, the protective coating layer comprising:
   a first coating; and
   a second coating disposed over the first coating, and
   a fluoropolymer or a fluorochemical deposited or grafted on a top surface of the protective coating layer,
   wherein
      the first coating and the second coating are thermally conductive, each of the first coating and second coating has a cross-plane thermal conductivity in a direction normal to a respective coating surface higher than 0.5 W/(m*K), the first coating and the second coating are each made of a material having substantially same chemical element or elements but different crystal or amorphous structures, different crystalline orientations, or a combination thereof to provide different hardnesses measured using nanoindentation, the first coating has a hardness lower than that of the second coating.

2. The electronic device of claim 1, wherein each of the first coating and the same coating has a thermal conductivity in the direction normal to the respective coating surface greater than or equal to 5 W/(m*K).

3. The electronic device of claim 1, wherein each of the first coating and the same coating has a thermal conductivity in the direction normal to the respective coating surface less than or equal to 2,000 W/(m*K).

4. The electronic device of claim 1, wherein the first coating has a hardness in a range of from 0.2 GPa to 1 GPa, and the second coating has a hardness in a range of from 1.1 GPa to 10 GPa.

5. The electronic device of claim 1, wherein the first coating has a hardness in a range of from 0.5 GPa to 10 GPa, and the second coating has a hardness in a range of from 10.1 GPa to 20 GPa.

6. The electronic device of claim 1, wherein the protective coating layer has a two-layer structure comprising the first coating and the second coating.

7. The electronic device of claim 1, wherein the protective coating layer has a three-layer sandwich structure comprising an additional second coating disposed below the first coating and above the thin film circuit layer.

8. The electronic device of claim 1, wherein the protective coating layer comprises a plurality of alternating layers of the first coating and the second coating.

9. The electronic device of claim 1, wherein the material is selected from the group consisting of diamond like carbon (DLC), silicon nitride, silicon oxynitride, boron nitride, boron oxynitride, aluminum nitride, aluminum oxynitride, aluminum boron nitride, silicon boron nitride, silicon aluminum nitride, SiAlON, titanium aluminum nitride, chromium nitride, tungsten nitride, and a combination thereof.

10. The electronic device of claim 9, wherein the material is boron nitride, the first coating is hexagonal boron nitride (h-BN) and the second coating is cubic boron nitride (c-BN).

11. The electronic device of claim 9, wherein the material is boron nitride comprising hexagonal crystal structure (h-BN), wherein the hexagonal plane of boron nitride in the first coating is oriented substantially parallel to the protective coating layer and the hexagonal plane of boron nitride in the second coating is oriented substantially normal to the protective coating layer.

12. The electronic device of claim 9 wherein the material is diamond-like carbon (DLC), wherein the second coating has a ratio of $sp^3$ to $sp^2$ DLC structures higher than that of the first coating.

13. The electronic device of claim 9, wherein the material is aluminum nitride, wherein the first coating comprises aluminum nitride being amorphous or having randomly oriented Wurtzite crystal structures and the second coating comprises aluminum nitride having Wurtzite crystal structure with a 001 or 002 crystal plane direction oriented substantially normal to the protective coating layer.

14. The electronic device of claim 13, wherein for at least one of the first coating and the second coating the material is aluminum nitride further in combination with titanium nitride (AlTiN) having a molar ratio of Ti/(Al+Ti) is in a range from 0.01 to 0.6.

15. The electronic device of claim 14, wherein the molar ratio of Ti/(Al+Ti) is in a range of from 0.05 to 0.4.

16. The electronic device of claim 1, wherein the protective coating layer has a thickness of equal to or less than 5 microns.

17. The electronic device of claim 1, wherein the substrate comprises a plastic or polymer and the electronic device is flexible.

18. The electronic device of claim 1, wherein the substrate comprises glass or silicon wafer, and the electronic device is rigid.

19. The electronic device of claim 1, wherein the substrate comprises a combination of plastic or polymer, and glass or silicon wafer.

20. The electronic device of claim 1, wherein the thin film circuit layer comprises fingerprint sensors.

21. An electronic device, comprising:
a substrate
a thin film circuit layer disposed over the substrate; and
a protective coating layer disposed over the thin film circuit layer, the protective coating layer having a sandwich structure comprising:
a first coating; and
two layers of a second coating, one layer of the second coating disposed below the first coating and the other layer of the second coating disposed over the first coating, and
a fluoropolymer or a fluorochemical deposited or grafted on a top surface of the protective coating layer,
wherein
the first coating and the second coating are thermally conductive,
each of the first coating and second coating has a cross-plane thermal conductivity in a direction normal to a respective coating surface higher than 0.5 W/(m*K),
the first coating and the second coating are each made of a material having substantially same chemical element or elements but different crystal or amorphous structures, different crystalline orientations, or a combination thereof to provide different hardnesses measured using nanoindentation,
the first coating has a hardness lower than that of the second coating.

* * * * *